(12) United States Patent
Takano et al.

(10) Patent No.: US 8,901,960 B2
(45) Date of Patent: Dec. 2, 2014

(54) FPGA MOUNTED APPARATUS AND FPGA CONFIGURATION METHOD

(71) Applicant: Fujitsu Limited, Kawasaki-shi, Kanagawa (JP)

(72) Inventors: Asuka Takano, Tsukuba (JP); Hideki Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 53 days.

(21) Appl. No.: 13/625,341

(22) Filed: Sep. 24, 2012

(65) Prior Publication Data

US 2013/0120022 A1 May 16, 2013

(30) Foreign Application Priority Data

Nov. 16, 2011 (JP) ................................. 2011-251112

(51) Int. Cl.
*H03K 19/173* (2006.01)
*G06F 9/445* (2006.01)
*G06F 11/00* (2006.01)
*H03K 19/177* (2006.01)

(52) U.S. Cl.
CPC .............................. *H03K 19/17756* (2013.01)
USPC ................. 326/41; 326/38; 326/46; 709/221; 709/216

(58) Field of Classification Search
USPC .................................... 326/40, 41, 38, 46, 47
See application file for complete search history.

(56) References Cited

U.S. PATENT DOCUMENTS

2010/0121748 A1* 5/2010 Handelman et al. ............ 705/34

FOREIGN PATENT DOCUMENTS

| JP | 2001-306343 | 11/2001 |
|----|-------------|---------|
| JP | 2005-190305 | 7/2005  |

* cited by examiner

*Primary Examiner* — Daniel D Chang
(74) *Attorney, Agent, or Firm* — Staas & Halsey LLP

(57) ABSTRACT

There is provided a field programmable gate array (FPGA) mounted apparatus included in a first node of a plurality of nodes connected on a network, the FPGA mounted housing apparatus including a printed circuit board (PCB) on which an FPGA is mounted, and a controller configured to issue a request to acquire configuration data of the FPGA to a second node of the plurality of nodes, and configure the FPGA based on the configuration data acquired from the second node in response to the request.

7 Claims, 12 Drawing Sheets

FIG. 3

| CARD TYPE | FPGA TYPE | CONFIG DATA INFORMATION | VERSION INFORMATION | CARD INFORMATION | | RETENTION NODE INFORMATION | PARTIAL DATA INFORMATION | | |
|---|---|---|---|---|---|---|---|---|---|
| | | | | SIZE (MBITS) | CHECKSUM | | DATA TYPE | SIZE (BITS) | CHECKSUM |
| Type 1 | FPGA #1 | FPGA1_ROM | 0001 | 150 | 0xFD5F | NODE A NODE C | DATA 11 | 574,876 | 0x34AF |
| | | | | | | | DATA 12 | 1,685,354 | 0xB5B1 |
| | | | | | | | DATA 13 | 236,161 | 0xABDF |
| | FPGA #2 | FPGA2_ROM | 0001 | 43 | 0x8139 | NODE B | DATA 21 | 716,600 | 0x79E6 |
| | | | | | | | DATA 22 | 382,049 | 0x98F4 |
| Type 2 | FPGA #3 | FPGA3_ROM | 0002 | 95 | 0xDF2C | NODE B | DATA 31 | 1,025,740 | 0xB07C |
| Type 3 | FPGA #4 | FPGA4_ROM | 0005 | 232 | 0xB0C4 | NODE A NODE D | ... | ... | ... |
| ... | | | | | | | | | |

FIG. 4

| NODE NAME | NODE ID | NETWORK INFORMATION 33A | |
|---|---|---|---|
| | | LOAD STATE | DISTANCE INFORMATION (NUMBER OF HOPS) |
| NODE A | 01 | NORMAL | 0 (SELF NODE) |
| NODE B | 02 | BUSY | 5 |
| NODE C | 03 | NORMAL | 2 |
| NODE D | 04 | NORMAL | 10 |
| ... | ... | ... | ... |

FIG. 7

| NODE NAME | NODE ID | NETWORK INFORMATION LOAD STATE | DISTANCE INFORMATION (NUMBER OF HOPS) | PRIORITY |
|---|---|---|---|---|
| NODE A | 01 | NORMAL | 0 (SELF NODE) | – |
| NODE O | 11 | NORMAL | 5 | 2 |
| NODE P | 12 | NORMAL | 3 | 1 |
| NODE Q | 13 | BUSY | 2 | 4 |
| NODE R | 14 | NORMAL | 8 | 3 |
| NODE S | 15 | VERY BUSY | 3 | – |

FPGA MOUNTED APPARATUS AND FPGA CONFIGURATION METHOD

CROSS-REFERENCE TO RELATED APPLICATION

This application is based upon and claims the benefit of priority of the prior Japanese Patent Application No. 2011-251112, filed on Nov. 16, 2011, the entire contents of which are incorporated herein by reference.

FIELD

The embodiments discussed herein are related to an FPGA mounted apparatus and an FPGA configuration method.

BACKGROUND

Recent advances in miniaturization technologies for semiconductor circuits has led to an increase in the circuit sizes of field-programmable gate arrays (FPGAs), which has in turn led to an increase in the size of FPGA configuration data (hereinafter simply referred to as config data). Additionally, partial configuration technology is being adopted, in which a single set of config data for an FPGA is partitioned into a plurality of partition data in order to modify the functions of a portion of a running FPGA, without stopping the other functions within the FPGA.

FIG. 12 illustrates an exemplary transmission system. The transmission system 100 illustrated in FIG. 12 includes a plurality of nodes 101 such as transmission apparatus, and a central management apparatus 102. The nodes 101 and the central management apparatus 102 are communicably connected via a network 103.

Each node 101 includes a plurality of FPGAs 111 and memory units 112. Config data for an FPGA 111 is stored in each memory unit 112. Each FPGA 111 executes a configuration process on the basis of config data stored in its memory unit 112. The central management apparatus 102 provides unified management of the config data for all FPGAs 111 in all nodes 101 on the network 103. Additionally, the central management apparatus 102 includes memory 121 and a management controller 122. The memory 121 may be realized by a hard disk drive (HDD) or semiconductor memory, for example, and config data for each type of FPGA 111 is stored in the memory 121. The management controller 122 provides overall control of the central management apparatus 102. The management controller 122 retrieves config data corresponding to the types of FPGAs 111 in a particular node 101 from the memory 121, and transmits the retrieved config data to the node 101 containing those FPGAs 111.

When a node 101 receives config data from the central management apparatus 102, the received config data is stored in the memory units 112 of the corresponding FPGAs 111. Additionally, the node 101 causes its FPGAs 111 to execute respective configuration processes on the basis of the config data stored in their memory units 112.

For more information, see Japanese Laid-open Patent Publication No. 2001-306343 and Japanese Laid-open Patent Publication No. 2005-190305.

SUMMARY

According to an aspect of the invention, there is provided a field programmable gate array (FPGA) mounted apparatus included in a first node of a plurality of nodes connected on a network, the FPGA mounted housing apparatus including a printed circuit board (PCB) on which an FPGA is mounted, and a controller configured to issue a request to acquire configuration data of the FPGA to a second node of the plurality of nodes, and configure the FPGA based on the configuration data acquired from the second node in response to the request.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 illustrates an exemplary table in a management table;

FIG. 4 illustrates an exemplary table in a device configuration database;

FIG. 7 illustrates an exemplary priority order related to a process of determining a download source node;

DESCRIPTION OF EMBODIMENTS

Figure 12:
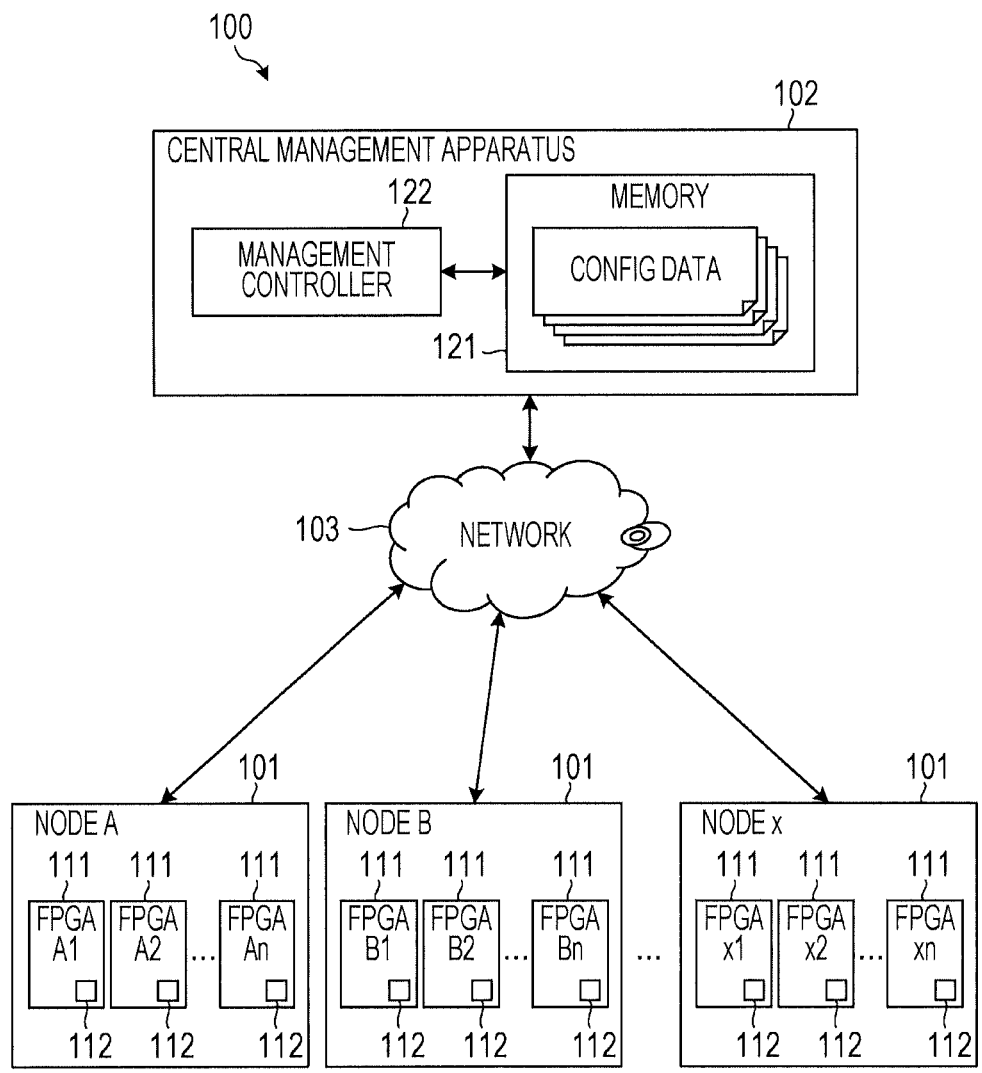
FIG. 12 illustrates an exemplary transmission system.

In FIG. 12, the central management apparatus 102 exclusively manages configuration data (hereinafter simply referred to as config data) for the FPGAs 111 in all nodes 101 on the network 103. As a result, the storage footprint of the config data in the memory 121 obviously increases, and the processing load for providing config data to each node 101 becomes concentrated in the central management apparatus 102.

Furthermore, although each node 101 downloads config data for its corresponding FPGAs 111, bandwidth usage on the network 103 becomes concentrated at the central management apparatus 102 in the case of concentrated downloading of config data by a plurality of nodes 101.

Moreover, the total amount of data is increased compared to ordinary config data in the case of adopting partial config functions that partition a single set of config data into a plurality of partition data. As a result, there is a significant concentration of processing load and bandwidth usage at the central management apparatus 102 when providing config data.

Consequently, it is desirable to provide an FPGA mounted apparatus and an FPGA configuration method configured such that the processing load and bandwidth usage are distributed when providing config data to FPGAs.

Hereinafter, embodiments of the FPGA mounted apparatus and an FPGA configuration method disclosed in this application will be described in detail and on the basis of the drawings. However, the disclosed technology is not limited by these embodiments. Furthermore, the respective embodiments described hereinafter may also be combined as appropriate, insofar as such combinations are not contradictory.

First Embodiment

Figure 1:
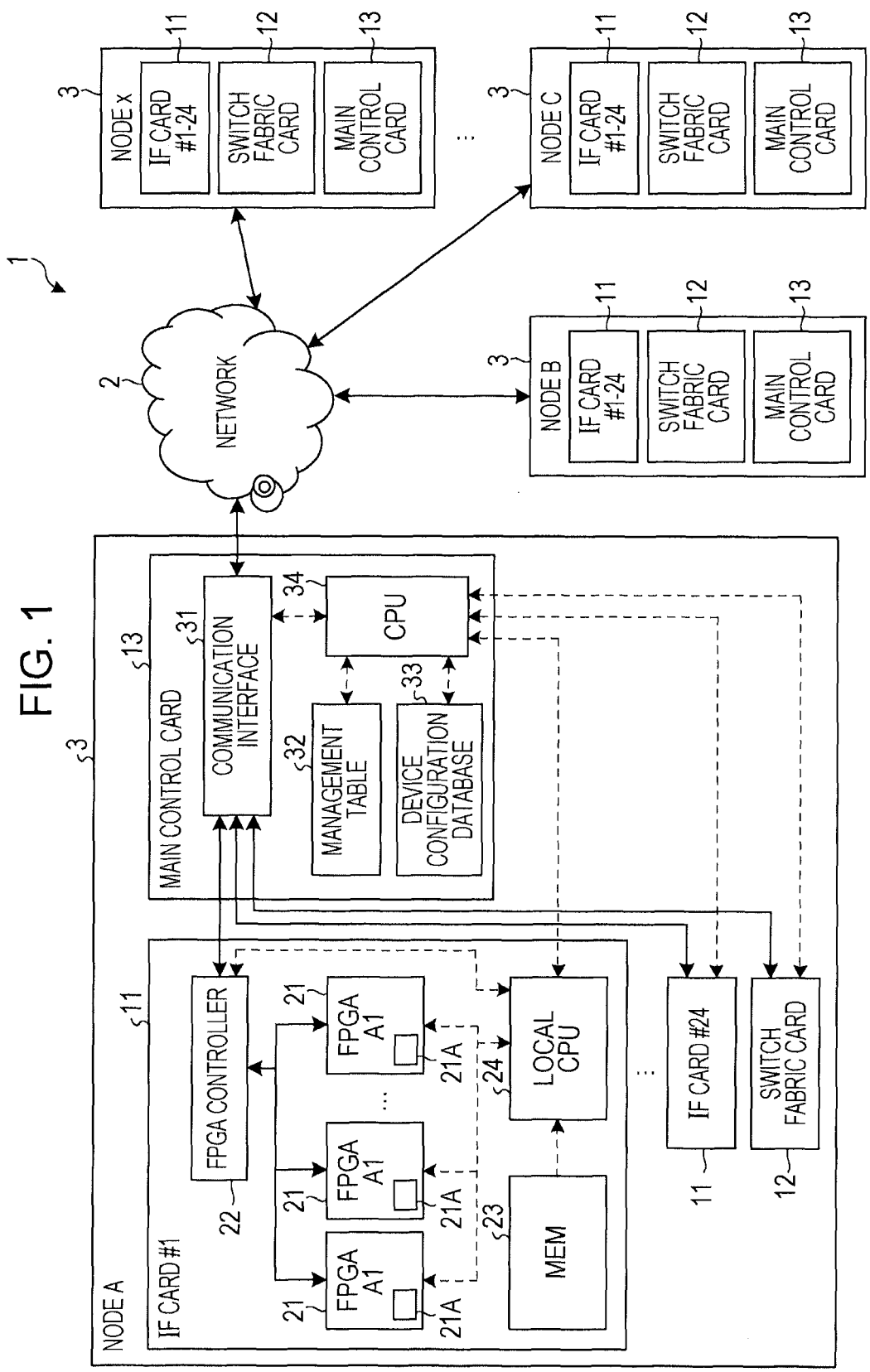
FIG. 1 illustrates an exemplary transmission system according to the First Embodiment.
Figure 2:
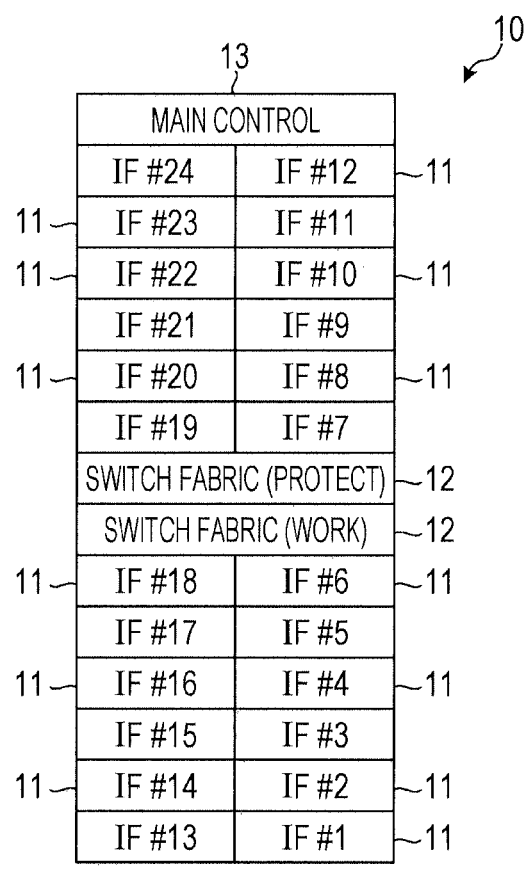
FIG. 2 illustrates an exemplary card slot configuration in a node according to the First Embodiment.

FIG. 1 illustrates an example of a transmission system according to the First Embodiment. FIG. 2 illustrates an exemplary card slot configuration in a node according to the First Embodiment. The transmission system 1 illustrated in FIG. 1 includes a plurality of nodes 3 such as transmission apparatus, which are connected by a network 2. In the transmission system 1, communication among the nodes 3 is realized via the network 2. Each node 3 includes one or more plug-in card housing apparatus 10 like that illustrated in FIG. 2. The plug-in card housing apparatus 10 houses a plurality of plug-in cards inserted into slots. Such plug-in cards may include 24 IF cards 11, two switch fabric cards 12, and one main control card 13, for example. Each of the plurality of plug-in cards includes a printed circuit board (PCB).

The IF cards 11 are provided with various expansion functions. There may be 24 IF cards from #1 to #24, for example. Also, each IF card 11 includes the PCB on which a plurality of field-programmable gate arrays (FPGAs) 21, an FPGA controller 22, memory 23, and a local CPU 24 are mounted.

The FPGAs 21 execute various processes on the basis of config data. Each FPGA 21 includes an integrated circuit not illustrated in the drawings, and memory 21A that stores config data used to control the integrated circuit. Herein, the memory 21A may be semiconductor memory such as static random access memory (SRAM), dynamic random access memory (DRAM), EEPROM, or flash memory, for example. Each FPGA controller 22 controls the configuration of its FPGA 21 on the basis of config data stored in the memory 21A included in that FPGA 21. Herein, the FPGA controller 22 may be a complex programmable logic device (CPLD), for example. Card information, such as the type of each plug-in card and the devices in use, is stored in the memory 23. Herein, the memory 23 may be electrically erasable and programmable read-only memory (EEPROM), for example. Each local CPU 24 includes functions for controlling its IF card 11 overall, as well as functions for coordinating communication with a local CPU 24 in another IF card 11, a local CPU in a switch fabric card 12, or a CPU 34 in the main control card 13.

Each switch fabric card 12 has built-in cross-connect functions for connecting the plug-in cards housed in the plug-in card housing apparatus 10. Although not illustrated in the drawings, each switch fabric card 12 also includes FPGAs 21, an FPGA controller 22, memory 23, and a local CPU 24, similarly to the IF cards 11.

The main control card 13 includes a communication interface 31, a management table 32, a device configuration database 33, and a CPU 34. The communication interface 31 is an interface that coordinates communication with other nodes 3 via the network 2.

FIG. 3 illustrates an exemplary table in a management table 32. The management table 32 illustrated in FIG. 3 manages card information 32A. The card information 32A includes a card type field 41, an FPGA type field 42, a config data information field 43, a version information field 44, a size field 45, a checksum field 46, a retention node information field 47, and a partial data information field 48. The card type field 41 contains information identifying the type of plug-in card. The FPGA type field 42 contains information identifying the types of FPGAs 21 on board a plug-in card. The config data information field 43 contains information identifying an area in the memory 21A where config data is stored in an FPGA 21. The version information field 44 contains information identifying the config data version. The size field 45 contains information indicating the data size of config data. The checksum field 46 contains information used for data error detection. The retention node information field 47 contains device-identifying information that identifies one or more nodes where config data is stored. The partial data information field 48 contains information on partial data into which config data has been partitioned.

The partial data information field 48 includes a data type field 48A, a size field 48B, and a checksum field 48C. The data type field 48A contains information identifying partial data. The size field 48B contains information indicating the data size of partial data. The checksum field 48C contains information used for partial data error detection.

FIG. 4 illustrates an exemplary table in a device configuration database 33. The device configuration database 33 manages information on plug-in cards inserted into nodes 3 and card-to-card connection layout information, as well as network information. The network information 33A illustrated in FIG. 4 is topology information for all nodes 3 in the transmission system 1. The network information 33A includes a node name field 51, a node identifier field 52, a load state field 53, and a distance information field 54. The node name field 51 contains information identifying a particular node in the transmission system 1. The node identifier field 52 contains identifier information that identifies a particular node in the transmission system 1. The load state field 53 contains information indicating the load state of a node 3. The load state may increase stepwise in order from Normal, to Busy, to Very Busy, for example. The distance information field 54 contains information indicating the number of hops from the self node 3 to a given node 3 in the transmission system 1. For example, in the case of the device configuration database 33 for a node 3 designated node A, the self node 3 is the node A, since the number of hops from node A to itself is 0, as illustrated in FIG. 4.

When acquiring config data for an FPGA 21 in an IF card 11, the CPU 34 in the main control card 13 references the management table 32 and requests to download the corresponding config data from a node 3 retaining that config data in its memory 21A.

In response to the download request, the CPU 34 in the main control card 13 of the node 3 storing the corresponding config data retrieves that config data from its memory 21A, and transmits the retrieved config data to the requesting node 3 that requested the download.

Upon receiving via the network 2 the corresponding config data from a node 3 storing that config data, the CPU 34 in the main control card 13 of the requesting node 3 stores the config data in the memory 21A of the corresponding FPGA 21 via the FPGA controller 22. In addition, the CPU 34 configures the corresponding FPGA 21 via the FPGA controller 22 on the basis of the config data stored in the memory 21A of that FPGA 21.

Figure 5:
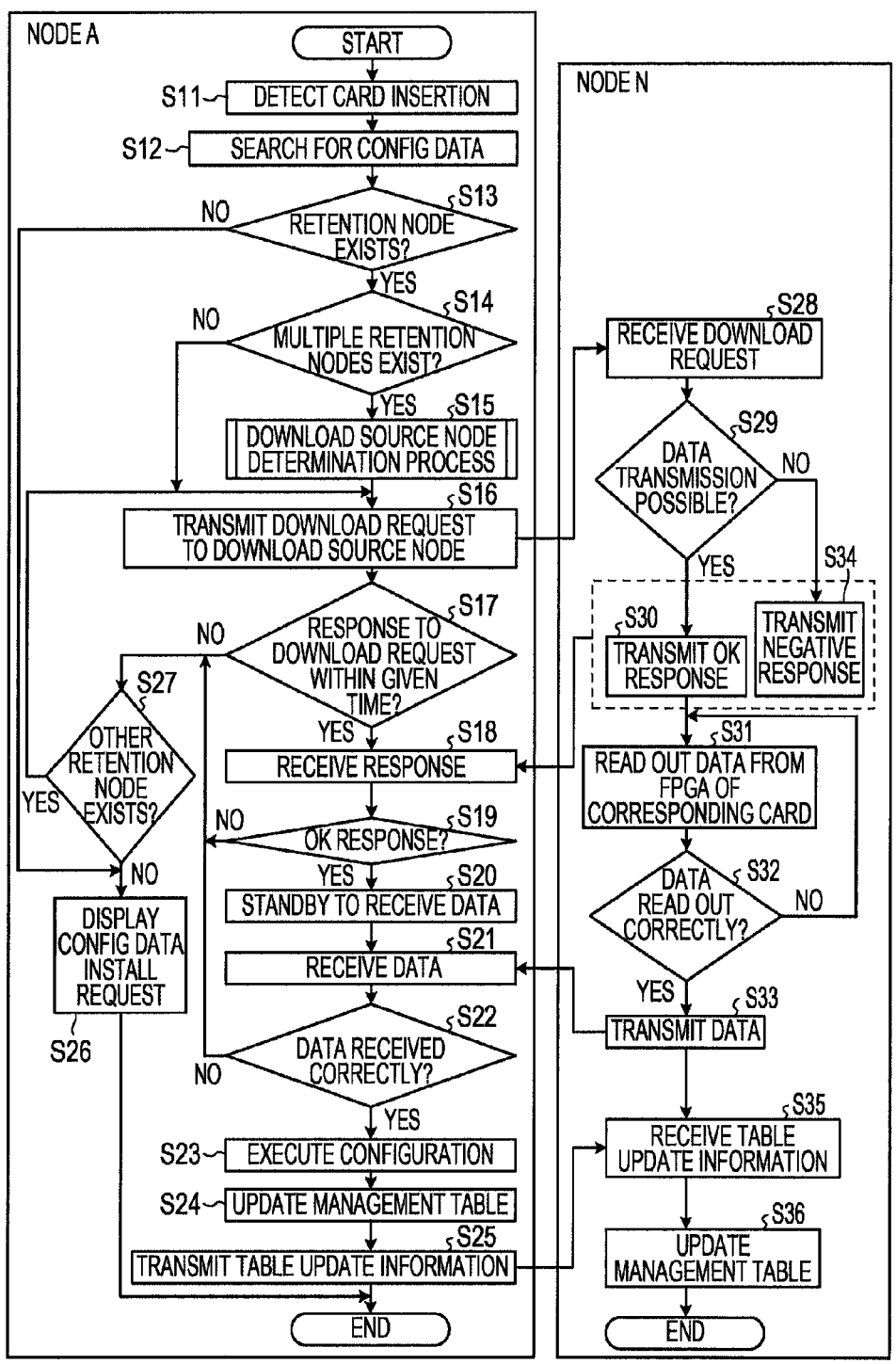
FIG. 5 is a flowchart illustrating exemplary processing operations related to a configuration process in respective nodes.

Next, operation of a transmission system 1 according to the First Embodiment will be described. FIG. 5 is a flowchart illustrating exemplary processing operations related to a configuration process in respective nodes 3. The configuration process illustrated in FIG. 5 involves downloading corresponding config data for an FPGA 21 in a requesting node 3 from another node 3 storing that config data, and configuring the FPGA 21 on the basis of the downloaded config data. Herein, the requesting node 3 is designated the node A and the download source node 3 is designated the node N as an example.

The CPU 34 in the main control card 13 of the node 3 designated "A" in FIG. 5 may, for example, detect the insertion of a new plug-in card such as an IF card 11 or a switch fabric card 12 (operation S11). Herein, when an insertion is detected, the CPU 34 identifies the card type on the basis of information stored in the memory 23 of the plug-in card. On the basis of the detected plug-in card type, the CPU 34 searches the management table 32 for retention node information 47 regarding one or more nodes 3 that retain, in their memory 21A, config data which can be used to configure the FPGAs 21 in the plug-in card (operation S12).

On the basis of the search results for the retention node information 47, the CPU 34 determines whether or not a node 3 retaining corresponding config data in its memory 21A exists on the network 2 (operation S13). In the case where a relevant node does exist on the network 2 (operation S13, Yes), the CPU 34 determines whether or not there exists a plurality of such nodes 3 storing the corresponding config data (operation S14). In the case where there exists a plurality of such nodes 3 storing the corresponding config data (operation S14, Yes), the CPU 34 executes the process of determining a download source node in FIG. 6, which determines a download source node 3 for the corresponding config data (operation S15).

The CPU 34 transmits a download request for the corresponding config data to a download source node 3 such as the node N, for example (operation S16), and determines whether or not there is a response to the download request within a given amount of time (operation S17). In the case where there is a response to the download request within a given amount of time (operation S17, Yes), the CPU 34 receives the response from the download source node 3 (operation S18).

Upon receiving a response from the download source node 3, the CPU 34 determines whether or not a positive (OK) response was received (operation S19). In the case where an OK response is received from the download source node 3 (operation S19, Yes), the CPU 34 stands by to receive config data from the download source node 3 (operation S20).

The CPU 34 stands by to receive config data, and then receives config data (operation S21). The FPGA controller 22 references information such as the size 45 and the checksum 46 in the management table 32 to determine whether or not the contents of the received config data are correct. On the basis of the determination by the FPGA controller 22, the CPU 34 determines whether or not config data was correctly received from the download source node 3 (operation S22).

In the case where config data is correctly received (operation S22, Yes), the CPU 34 stores the config data in the memory 21A of a corresponding FPGA 21, and causes the FPGA 21 to be configured on the basis of the stored config data (operation S23). Subsequently, after the FPGA 21 is configured, the CPU 34 updates its management table 32 in order to add the self node 3 as retention node information 47 regarding the nodes 3 retaining the config data (operation S24). The CPU 34 transmits table update information for the management table 32 to neighboring nodes 3 (operation S25), and then ends the processing operations illustrated in FIG. 5.

Meanwhile, in the case where a node 3 storing the corresponding config data does not exist on the network 2 (operation S13, No), the CPU 34 outputs a message requesting the installation of config data (operation S26). Herein, the CPU 34 may cause the install request to be displayed on a display as a warning prompt, for example. As a result, the user views the warning prompt and installs config data.

Meanwhile, in the case where there does not exist a plurality of nodes 3 storing the corresponding config data (operation S14, No), the CPU 34 takes the relevant node 3 to be the download source node 3, and proceeds to operation S16 in order to transmit a download request to the download source node 3. Meanwhile, in the case where there is no response to the download request within a given amount of time (operation S17, No), the CPU 34 determines whether or not there exists another node 3 storing the corresponding config data (operation S27). In the case where another node 3 storing the corresponding config data does exist (operation S27, Yes), the CPU 34 proceeds to operation S16 in order to transmit a download request to the node 3 storing the corresponding config data. Meanwhile, in the case where another node 3 storing the corresponding config data does not exist (operation S27, No), the CPU 34 proceeds to operation S26 in order to output a message requesting the installation of config data.

Meanwhile, in the case where the CPU 34 of the download source node 3 receives a download request from operation S16 (operation S28), the CPU 34 determines whether or not data transmission is possible (operation S29). In the case where data transmission is possible (operation S29, Yes), the CPU 34 of the download source node 3 transmits an OK response to the requesting node 3 via the network 2 (operation S30).

The CPU 34 of the download source node 3 retrieves config data from the memory 21A in the FPGAs 21 of a corresponding card via the FPGA controller 22 (operation S31). Herein, the FPGA controller 22 references information such as the size 45 and the checksum 46 in the management table 32 to determine whether or not the contents of the retrieved config data are correct. On the basis of the determination results from the FPGA controller 22, the CPU 34 determines whether or not the retrieved config data was correctly retrieved (operation S32).

In the case where the config data is correctly retrieved (operation S32, Yes), the CPU 34 of the download source node 3 transmits the retrieved config data to the requesting node 3 via the network 2 (operation S33).

Meanwhile, in the case where data transmission is unavailable (operation S29, No), the CPU 34 of the download source node 3 transmits a negative response to the requesting node 3 via the network 2 (operation S34). Also, in the case where the config data is not correctly retrieved (operation S32, No), the CPU 34 of the download source node 3 proceeds to operation S31 in order to re-retrieve config data from the FPGAs 21.

Meanwhile, in the case where the CPU 34 of the requesting node 3 does not receive an OK response from the download source node 3 (operation S19, No), the CPU 34 proceeds to operation S27 in order to determine whether or not there exists another node 3 storing the corresponding config data. Also, in the case where the CPU 34 of the requesting node 3 does not correctly receive config data from the download source node 3 (operation S22, No), the CPU 34 proceeds to operation S27 in order to determine whether or not there exists another node 3 storing the corresponding config data.

Additionally, when the CPU 34 of the download source node 3 receives new table update information from the requesting node 3 (operation S35), the CPU 34 updates its management table 32 on the basis of the table update information (operation S36), and ends the processing operations illustrated in FIG. 5.

The requesting node 3 illustrated in FIG. 5 references a management table 32 and issues a download request to a download source node 3 from among nodes 3 storing config data used to configure FPGAs 21. The requesting node 3 stores config data downloaded from the download source node 3 in the memory 21A of a corresponding FPGA 21, and configures that FPGA 21 on the basis of the stored config data. As a result, each node 3 is able to download config data for an FPGA 21 of the same type from another node 3 on the network 2.

Figure 6:
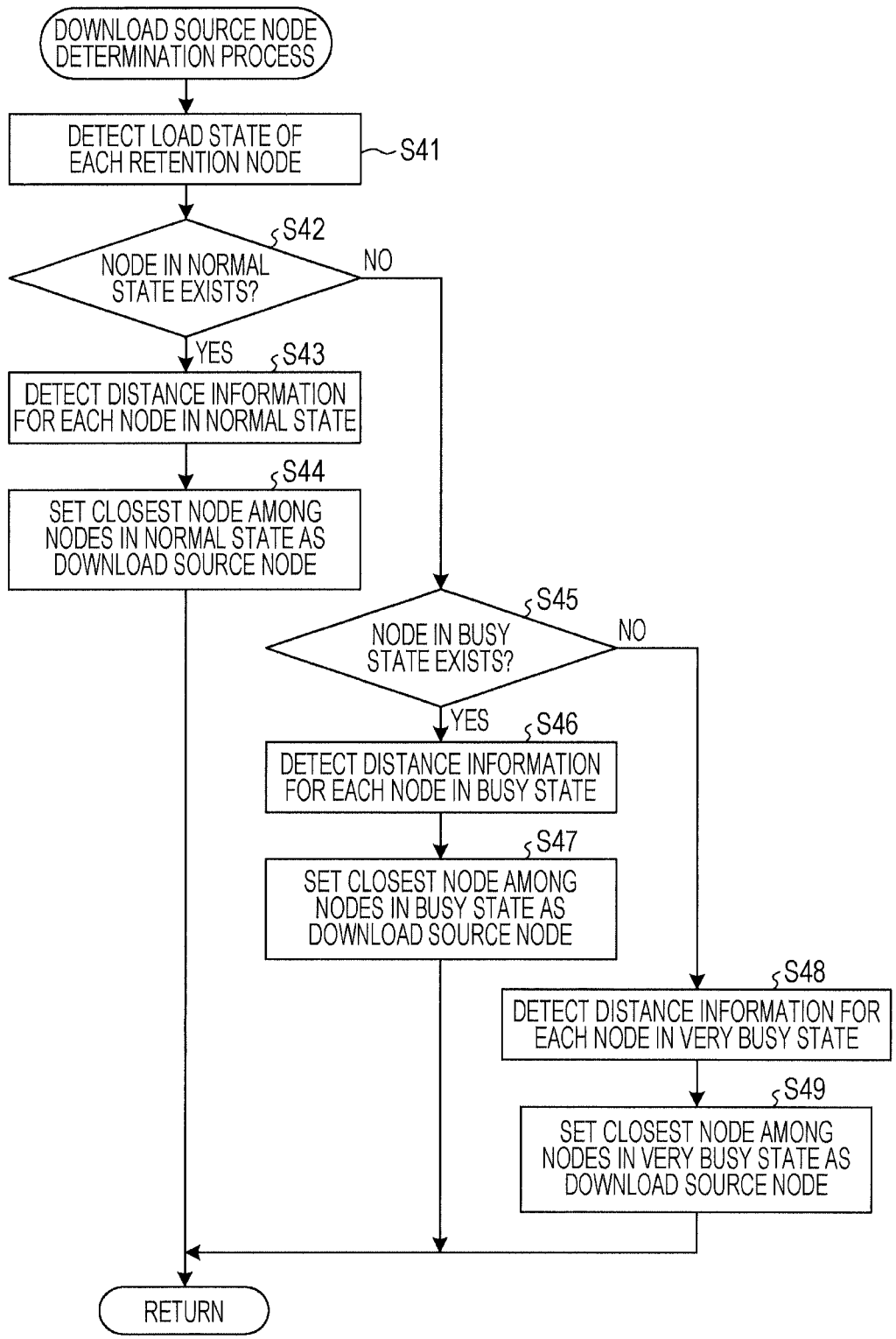
FIG. 6 is a flowchart illustrating exemplary processing operations related to a process of determining a download source node in a node.

FIG. 6 is a flowchart illustrating exemplary processing operations related to a process of determining a download source node in a node 3. The process of determining a download source node illustrated in FIG. 6 determines the download source node 3 with the optimal download efficiency from among nodes 3 storing corresponding config data, on the basis of the load state 53 and the distance information 54 in the network information 33A.

In FIG. 6, the CPU 34 of a requesting node 3 detects the load state of each node 3 retaining corresponding config data in the memory 21A, on the basis of the load state 53 in the device configuration database 33 (operation S41). The CPU 34 respectively determines whether or not each node 3 storing the corresponding config data is in a Normal load state (operation S42). In the case where at least one node 3 storing the corresponding config data is in a Normal load state (operation S42, Yes), the CPU 34 detects distance information for each node 3 in the Normal state on the basis of the distance information 54 in the device configuration database 33 (operation S43).

On the basis of the distance information, the CPU 34 determines the node 3 that is closest to the self node 3 from among the nodes 3 in the Normal state to be the optimal download source node 3 (operation S44), and ends the processing operations illustrated in FIG. 6. FIG. 7 illustrates an exemplary priority order related to a process of determining a download source node. In the processing of operation S44, a download source node 3 priority order is determined as illustrated in FIG. 7. As a result, the CPU 34 determines that a node P, which is in the Normal state and whose distance information 54 indicates 3 hops, is the optimal download source node 3.

Meanwhile, in the case where no node 3 storing the corresponding config data is in a Normal load state (operation S42, No), the CPU 34 respectively determines whether or not each node 3 storing the corresponding config data is in a Busy load state (operation S45). In the case where at least one node 3 storing the corresponding config data is in a Busy load state (operation S45, Yes), the CPU 34 detects distance information for each node 3 in the Busy state on the basis of the distance information 54 in the device configuration database 33 (operation S46). Additionally, on the basis of the distance information, the CPU 34 determines the node 3 that is closest to the self node 3 from among the nodes 3 in the Busy state to be the optimal download source node 3 (operation S47), and ends the processing operations illustrated in FIG. 6.

In the case where no node 3 storing the corresponding config data is in a Busy load state (operation S45, No), the CPU 34 detects distance information for each node 3 in the Very Busy state on the basis of the distance information 54 in the device configuration database 33 (operation S48). Additionally, on the basis of the distance information, the CPU 34 determines the node 3 that is closest to the self node 3 from among the nodes 3 in the Very Busy state to be the optimal download source node 3 (operation S49), and ends the processing operations illustrated in FIG. 6.

In the process illustrated in FIG. 6, a node 3 which is in a Normal load state and whose distance information indicates that it is the closest node 3 to the self node 3 from among a plurality of nodes 3 storing corresponding config data is determined to be the download source node 3 with the optimal download efficiency. As a result, the download source node 3 with the optimal download efficiency is automatically determined from among a plurality of nodes 3 storing corresponding config data.

Figure 8:
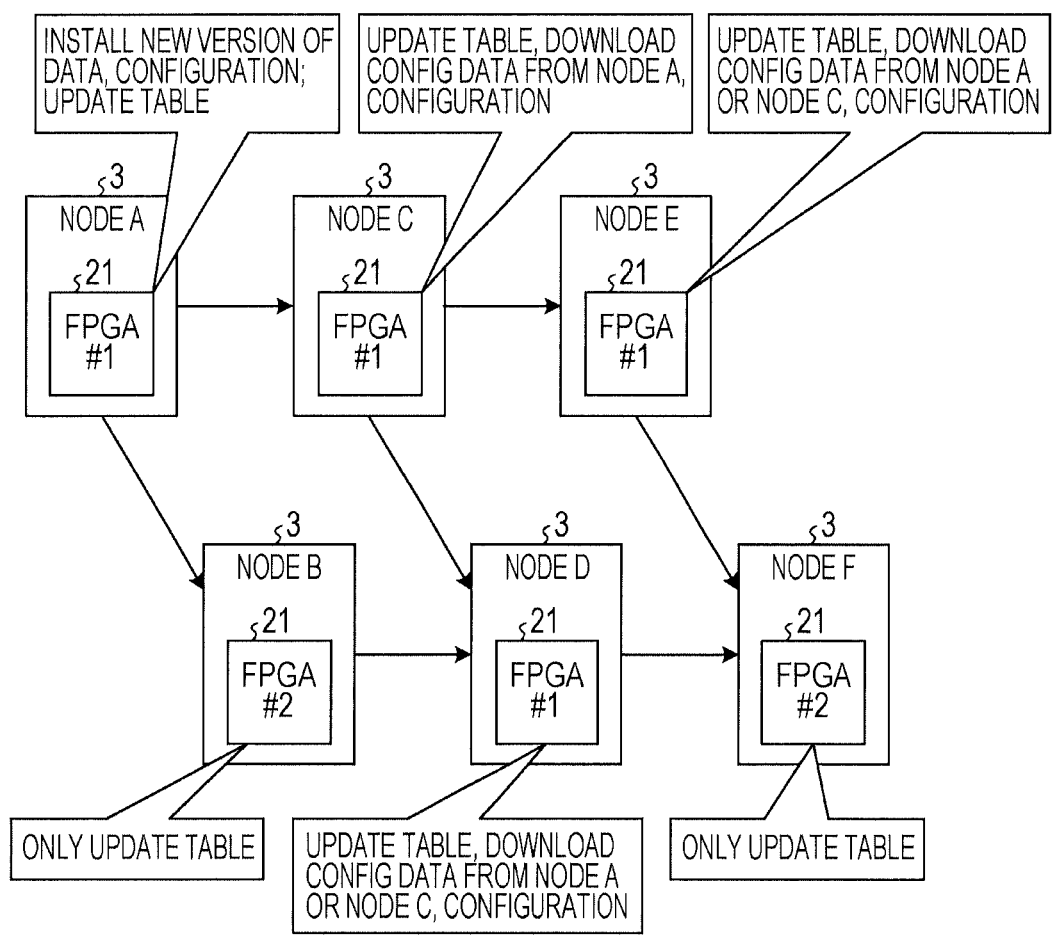
FIG. 8 illustrates the flow of config data and table update information in a transmission system.

FIG. 8 illustrates the flow of config data and table update information in a transmission system 1. The transmission system 1 illustrated in FIG. 8 includes six nodes 3 from A to F, for example, which are labeled node A to node F (each reference number 3 is omitted.). Node A, node C, node D, and node E each include an FPGA 21 of a type #1. In contrast, node B and node F each include an FPGA 21 of a type #2. Additionally, node A is herein taken to store a new version of config data in the memory 21A of the type #1 FPGA 21. At this point, node A updates its management table 32 on the basis of the new version of the config data. Herein, the CPU 34 clears the retention node information 47 regarding the config data in the management table 32, and updates the field by adding the self node 3 as the retention node information 47.

Node A transmits table update information for the management table 32 to its neighboring nodes C and B. In addition, node B transmits the table update information to its neighboring node D, which then transmits the table update information to node F. Similarly, node C transmits the table update information to its neighboring node E.

The respective nodes 3 from node A to node F update their respective management tables 32 on the basis of the table update information. Node C references its management table 32, and upon detecting the new version of config data for the type #1 FPGA 21, issues a config data download request to node A, the node 3 storing the corresponding config data. Node C downloads config data corresponding to the download request from node A, and stores the config data in the memory 21A. Additionally, node C configures its FPGA 21 on the basis of the stored config data. As a result, node C transmits table update information adding the self node 3 to the retention node information 47 in the management table 32 to each node 3 in the transmission system 1. Subsequently, all nodes 3 in the transmission system 1 update the retention node information 47 regarding the corresponding config data in the management table 32 on the basis of the table update information.

Meanwhile, Node D references its management table 32, and upon detecting the new version update of the config data for the type #1 FPGA 21, issues a config data download request to, for example, its neighboring node C. Node D downloads config data corresponding to the download request from node C, and stores the config data in the memory 21A. Additionally, node D configures its FPGA 21 on the basis of the stored config data. As a result, node D transmits table update information adding the self node 3 to the retention node information 47 in the management table 32 to each node 3 in the transmission system 1. Subsequently, all nodes 3 in the transmission system 1 update the retention node information 47 regarding the corresponding config data in the management table 32 on the basis of the table update information.

In the transmission system 1 illustrated in FIG. 8, neighboring nodes 3 download the latest config data from neighboring nodes 3 storing the corresponding config data, on the basis of table updates for a management table 32. The nodes 3 then store the latest config data thus downloaded in the memory 21A of their FPGAs 21.

Also, if a failure or other error is detected and a change occurs in the network information 33A and the card information 32A due to the failure, the nodes 3 transmit table update information reflecting that change to their neighboring nodes 3. On the basis of the table update information, the CPU 34 in each node 3 updates the contents of the management table 32 and the device configuration database 33. Moreover, rather than just detecting failures, the nodes 3 may also periodically monitor communication conditions on the network 2 or communication conditions between the nodes 3, and on the basis of those monitoring results, transmit table update information reflecting the monitoring results to their neighboring nodes 3.

Figure 9:
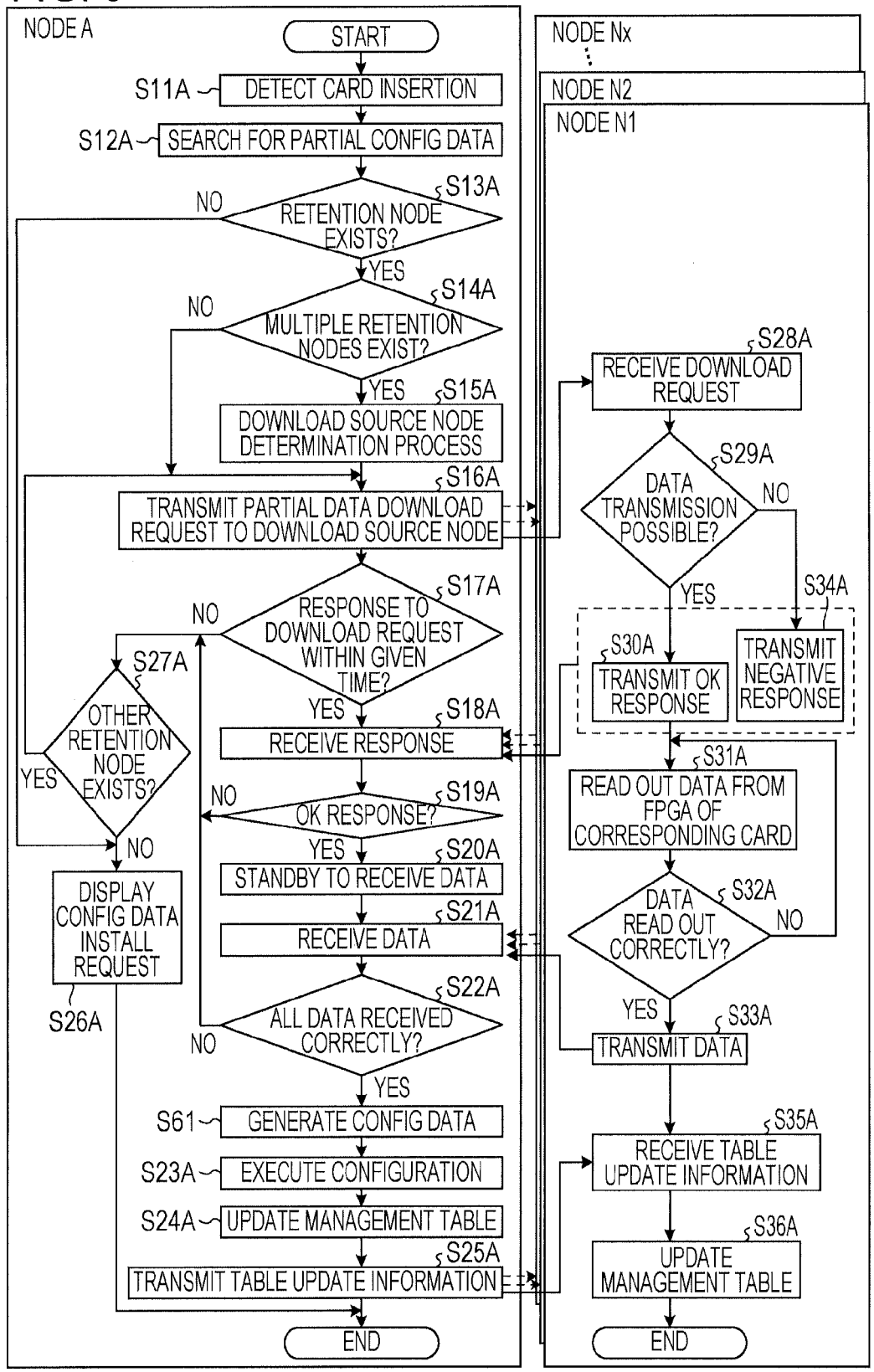
FIG. 9 is a flowchart illustrating exemplary processing operations related to a partial configuration process in respective nodes.

Next, operation will be described for the case where the config data is partitioned into a plurality of partial data. FIG. 9 is a flowchart illustrating exemplary processing operations related to a partial configuration process in respective nodes 3. The partial configuration process involves downloading partial config data used to configure an FPGA 21 in a requesting node 3 from another node 3, and configuring the FPGA 21 on the basis of the downloaded partial data.

In FIG. 9, the CPU 34 of a requesting node 3 detects the insertion of a new plug-in card (operation S11A). Herein, the CPU 34 identifies the card type on the basis of information stored in the memory 23 of the detected plug-in card. On the basis of the plug-in card type, the CPU 34 searches the management table 32 for retention node information 47 regarding one or more nodes 3 that retain, in their memory 21A, partial config data which can be used to configure the FPGAs 21 in the plug-in card (operation S12A).

On the basis of retention node information 47 returned as search results, the CPU 34 determines whether or not a node 3 retaining corresponding partial data in its memory 21A exists on the network 2 (operation S13A). In the case where a relevant node does exist on the network 2 (operation S13A, Yes), the CPU 34 determines whether or not there exists a plurality of such nodes 3 storing the corresponding partial data (operation S14A). In the case where there exists a plurality of such nodes 3 storing the corresponding partial data (operation S14A, Yes), the CPU 34 executes the process of determining a download source node in order to determine respective download source nodes 3 for the corresponding partial data (operation S15A). Herein, the CPU 34 executes the process of determining a download source node and determines, on the basis of the load state 53 and the distance information 54, an optimal download source node 3 for each piece of corresponding partial data from among the plurality of nodes 3 storing the plurality of corresponding partial data.

The CPU 34 transmits a download request for corresponding partial data to respective download source nodes 3 such as the nodes N1 to Nx, for example (operation S16A), and respectively determines whether or not there is a response to each download request within a given amount of time (operation S17A). In the case where there is a response to a download request within a given amount of time (operation S17A, Yes), the CPU 34 receives the response from the corresponding download source node 3 (operation S18A).

Upon receiving a response from a download source node 3, the CPU 34 determines whether or not a positive (OK) response was received (operation S19A). In the case where an OK response is received from a download source node 3 (operation S19A, Yes), the CPU 34 stands by to receive partial data from that download source node 3 (operation S20A).

The CPU 34 stands by to receive partial data, and then receives partial data from respective nodes 3 (operation S21A). Via the FPGA controller 22, the CPU 34 determines whether or not all partial data was correctly received from the respective download source nodes 3 (operation S22A).

In the case where all partial data is correctly received (operation S22A, Yes), the CPU 34 reconstructs config data from the complete set of partial data (operation S61). The CPU 34 stores the reconstructed config data in the memory 21A of a corresponding FPGA 21, and causes the FPGA 21 to be configured on the basis of the stored config data (operation S23A). Subsequently, after the FPGA 21 is configured, the CPU 34 updates its management table 32 in order to add the self node 3 as retention node information 47 regarding that config data (operation S24A). The CPU 34 transmits table update information for the management table 32 to neighboring nodes 3 (operation S25A), and then ends the processing operations illustrated in FIG. 9.

Meanwhile, in the case where a node 3 retaining corresponding partial data in its memory 21A does not exist on the network 2 (operation S13A, No), the CPU 34 outputs a message requesting the installation of config data (operation S26A). Herein, the CPU 34 may cause the install request to be displayed on a display as a warning prompt, for example. As a result, the user views the warning prompt and installs config data.

Meanwhile, in the case where there does not exist a plurality of nodes 3 storing corresponding partial data (operation S14A, No), the CPU 34 takes the relevant node 3 to be the download source node 3, and proceeds to operation S16A in order to transmit a download request to the download source node 3. Meanwhile, in the case where there is no response to a download request within a given amount of time (operation S17A, No), the CPU 34 determines whether or not there exists another node 3 storing corresponding partial data (operation S27A). In the case where another node 3 storing corresponding partial data does exist (operation S27A, Yes), the CPU 34 proceeds to operation S16A in order to transmit a download request to the node 3 storing the corresponding partial data. Meanwhile, in the case where another node 3 storing the corresponding partial data does not exist (operation S27A, No), the CPU 34 proceeds to operation S26A in order to display an install request.

Meanwhile, in the case where the CPU 34 of a download source node 3 receives a download request from operation S16A (operation S28A), the CPU 34 determines whether or not data transmission is possible (operation S29A). In the case where data transmission is possible (operation S29A, Yes), the CPU 34 of the download source node 3 transmits an OK response to the requesting node 3 via the network 2 (operation S30A).

The CPU 34 of the download source node 3 retrieves corresponding partial data from the memory 21A in the FPGAs 21 of a corresponding card via the FPGA controller 22 (operation S31A). Herein, the FPGA controller 22 references information such as the size 45 and the checksum 46 in the management table 32 to determine whether or not the contents of the retrieved partial data are correct. On the basis of the determination results from the FPGA controller 22, the CPU 34 determines whether or not the retrieved partial data was correctly retrieved (operation S32A).

In the case where the partial data is correctly retrieved (operation S32A, Yes), the CPU 34 of the download source node 3 transmits the retrieved partial data to the requesting node 3 via the network 2 (operation S33A).

Meanwhile, in the case where data transmission is unavailable (operation S29A, No), the CPU 34 of the download source node 3 transmits a negative response to the requesting node 3 via the network 2 (operation S34A). Also, in the case where the partial data is not correctly retrieved (operation S32A, No), the CPU 34 of the download source node 3 proceeds to operation S31A in order to re-retrieve partial data from the FPGAs 21.

Meanwhile, in the case where the CPU 34 of the requesting node 3 does not receive an OK response from a download source node 3 (operation S19A, No), the CPU 34 proceeds to operation S27A in order to determine whether or not there exists another node 3 storing the corresponding partial data. Also, in the case where the CPU 34 of the requesting node 3 does not correctly receive partial data from a download source node 3 (operation S22A, No), the CPU 34 proceeds to operation S27A in order to determine whether or not there exists another node 3 storing the corresponding partial data.

Additionally, when the CPU 34 of a download source node 3 receives new table update information from the requesting node 3 (operation S35A), the CPU 34 updates its management table 32 on the basis of the table update information (operation S36A), and ends the processing operations illustrated in FIG. 9.

The requesting node 3 illustrated in FIG. 9 references a management table 32 and issues partial data download requests to respective download source nodes 3 from among nodes 3 storing partial config data used to configure FPGAs 21. The requesting node 3 stores partial data downloaded from respective download source nodes 3 in the memory 21A of a corresponding FPGA 21, and configures that FPGA 21 on the basis of the stored partial data. As a result, each node 3 is able to download partial data for an FPGA 21 of the same type from another node 3 on the network 2.

A node 3 according to the First Embodiment references a management table 32 and identifies another node 3 which exists on the same network 2 and which retains config data corresponding to a type of FPGA 21 in its memory 21A. Subsequently, the node 3 issues a config data download request to the identified node 3, and configures its FPGAs 21 on the basis of downloaded config data. As a result, the FPGAs 21 in all nodes 3 storing config data become equivalent to the FPGAs 21 in the download source node 3, and thus the bandwidth usage and processing load is distributed when providing config data to respective nodes 3.

Moreover, since the number of nodes 3 storing config data increases as the scale of the network 2 increases, a high level of redundancy can be ensured for the config data. As a result, loss or corruption of config data can be dealt with quickly, and config data can be rapidly acquired even in the case of a failure in a portion of the network 2.

Also, since the First Embodiment does not involve a high-capacity storage device such as a central management apparatus that exclusively manages config data for the nodes 3 as in the related art, such costs can be reduced and the deployment size can be increased.

Also, in the First Embodiment, a node 3 which is in a Normal load state and whose distance information indicates that it is the closest node 3 to the self node 3 from among a plurality of nodes 3 storing corresponding config data is determined to be the download source node 3 with the optimal download efficiency. As a result, the download source node 3 with the optimal download efficiency is automatically determined from among a plurality of nodes 3 storing corresponding config data.

Also, a node 3 according to the First Embodiment references a management table 32 and identifies nodes 3 retaining, in their memory 21A, partial data into which config data has been partitioned plurally. Subsequently, the node 3 issues partial data download requests to the identified nodes 3, and configures its FPGAs 21 on the basis of a complete set of partial data. As a result, increases in data size and partial configuration functions can be amply accommodated.

Also, in the First Embodiment, when config data is updated in a single node 3 on the network 2, it becomes possible to update the FPGAs 21 over the entire network 2 via neighboring nodes 3 rather than installing the config data individually.

Second Embodiment

Figure 10:
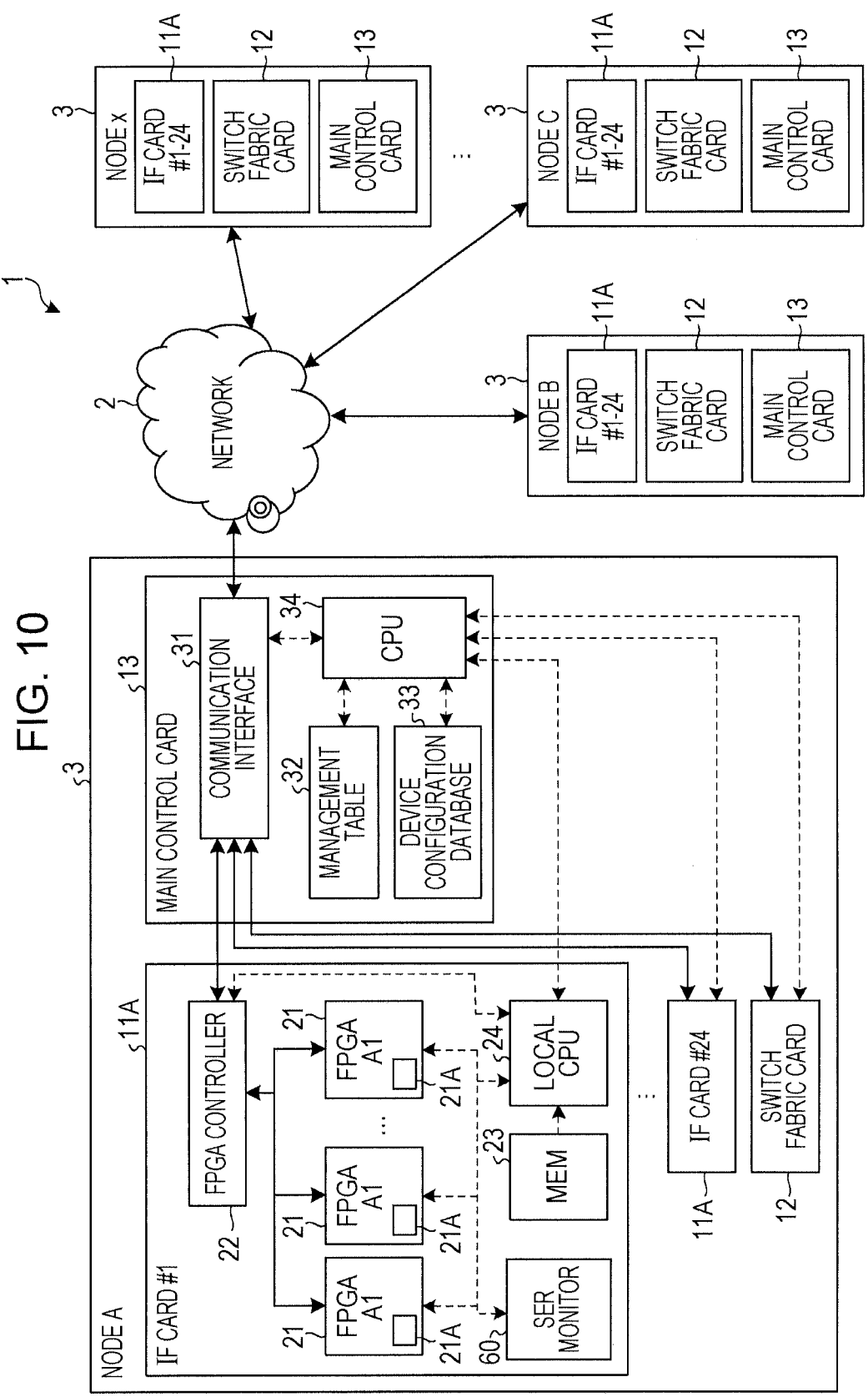
FIG. 10 illustrates an exemplary transmission system according to the Second Embodiment.

FIG. 10 illustrates an example of a transmission system 1 according to the Second Embodiment. Herein, like reference signs are given to portions of the configuration which are similar to those of a transmission system 1 according to the First Embodiment, and duplicate description of the configuration and operation of such portions will be reduced or omitted. An IF card 11A in a node 3 illustrated in FIG. 10 includes an SER monitor 60 that monitors for software errors in FPGAs 21. Herein, software errors may be, for example, 1-bit errors or contemporaneous errors in 2 or more bits, or in other words multi-bit errors. Upon detecting a multi-bit error in an FPGA 21, the SER monitor 60 identifies a block of config data, such as partial data, for example, that is being affected when the multi-bit error is detected.

In the case where a 1-bit error is detected by the SER monitor 60, the CPU 34 of the main control card 13 executes error correction with an error detection and correction (ECC) circuit not illustrated in the drawings.

In addition, when a multi-bit error in an FPGA 21 is detected, or in other words, when the CPU 34 detects a notification identifying partial data from when a multi-bit error in an FPGA 21 is detected by the SER monitor 60, the CPU 34 searches the management table 32 for retention node information 47 regarding a node 3 retaining the identified partial data in its memory 21A. The CPU 34 issues a download request for the partial data to the node 3 corresponding to the retention node information 47 returned by the search.

When partial data corresponding to the download request is received from a node 3 storing the corresponding partial data, the CPU 34 stores the partial data in the memory 21A of an FPGA 21. The CPU 34 then configures the FPGA 21 via the FPGA controller 22 on the basis of config data stored in the memory 21A included in that FPGA 21.

In the Second Embodiment, when partial data being affected by a detected multi-bit error in an FPGA 21 is identified via a SER monitor 60, a management table 32 is referenced and a download request for the partial data is issued to a node 3 storing the identified partial data. As a result, corresponding partial data can be acquired from another node 3 storing the corresponding partial data even in cases where a multi-bit error occurs in local partial data and the config data is partially corrupted. For this reason, data integrity can be rapidly restored, even for software errors which are not corrected by ECC.

Third Embodiment

Figure 11:
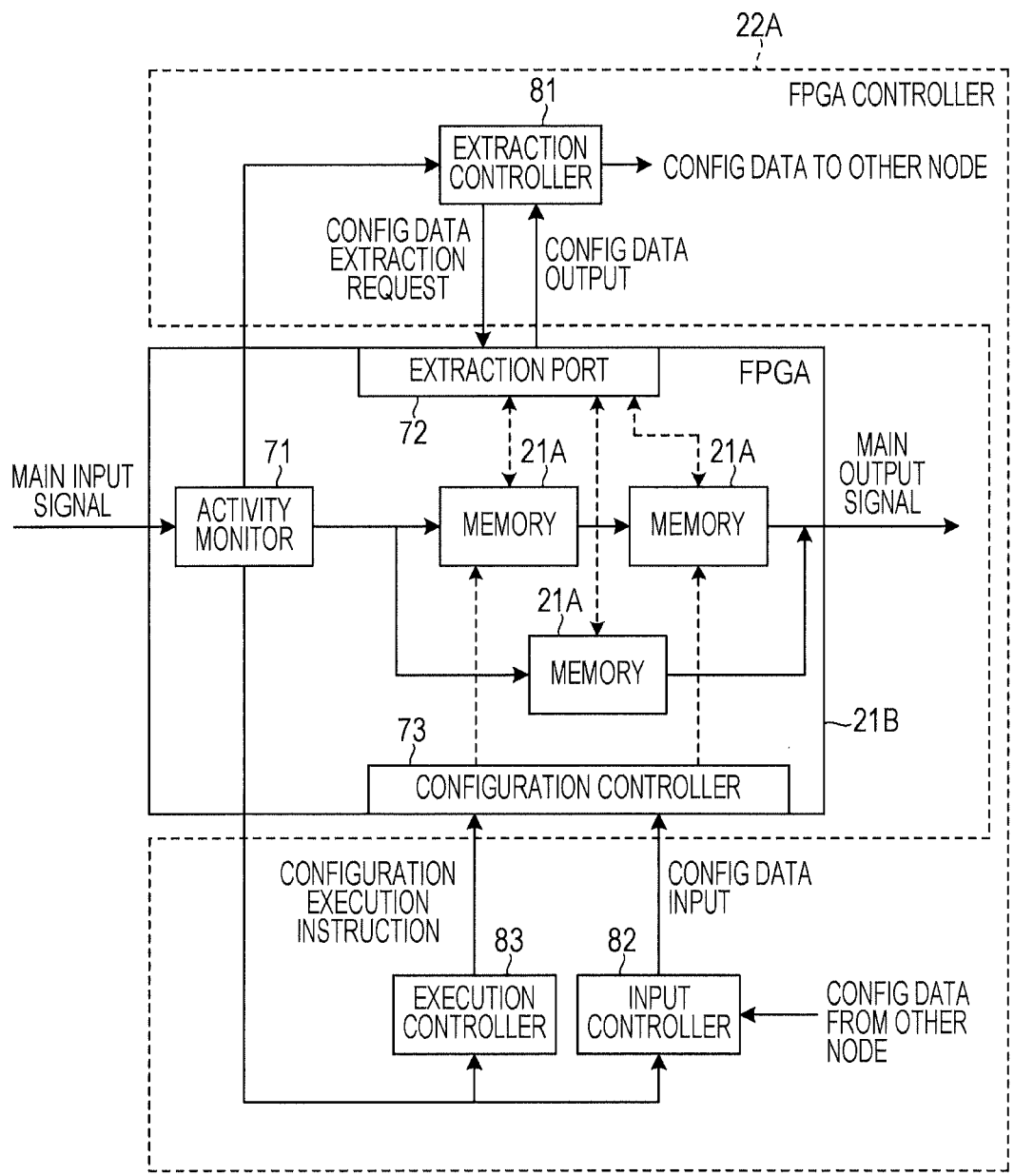
FIG. 11 illustrates exemplary processing operations conducted between an FPGA and an FPGA controller in a node according to the Third Embodiment.

A transmission system according to the Third Embodiment will now be described. FIG. 11 illustrates exemplary processing operations conducted between an FPGA and an FPGA controller in an IF card according to the Third Embodiment. Herein, like reference signs are given to portions of the configuration which are similar to those of a transmission system 1 according to the First Embodiment, and duplicate description of the configuration and operation of such portions will be reduced or omitted.

The FPGA 21B illustrated in FIG. 11 includes memory 21A, an activity monitor 71, an extraction port 72, and a configuration controller 73. The memory 21A are memory areas for storing partial config data. The activity monitor 71 is a circuit that monitors the activity of a main signal processed by the FPGA 21B. Herein, activity refers to a level indicating the proportion of valid data that is actually used in the main signal, with the proportions being designated high level, medium level, low level, and zero level in descending order. In other words, when the activity is high level, the load state of the FPGA 21B is at a high level. When the activity is medium level, the load state of the FPGA 21B is at a medium level. When the activity is low level, the load state of the FPGA 21B is at a low level. Meanwhile, when the activity is zero level, the load state of the FPGA 21B is in a non-processing state, such as a state in which idle data is flowing, for example.

The extraction port 72 is a port from which partial data stored in the memory 21A is extracted. The configuration controller 73 stores configuration data acquired via the FPGA controller 22A, such as partial data, for example, in corresponding memory 21A. Additionally, the configuration controller 73 configures the FPGA 21B on the basis of partial data stored in the memory 21A.

Additionally, the FPGA controller 22A includes an extraction controller 81, an input controller 82, and an execution controller 83. The extraction controller 81 extracts corresponding data stored in corresponding memory 21A via the extraction port 72 in the FPGA 21B, in response to a download request from a requesting node 3. The input controller 82 stores data acquired from a download source node 3 in corresponding memory 21A in the FPGA 21B via the configuration controller 73 in the FPGA 21B. The execution controller 83 instructs the configuration controller 73 in the FPGA 21B to execute a configuration process based on config data in corresponding memory 21A.

After receiving a download request, the extraction controller 81 initiates extraction of the corresponding data from the memory 21A only in the case where the activity is low level as indicated by the activity monitor 71. After receiving data from a download source node 3, the input controller 82 initiates operations to store the data in corresponding memory 21A only in the case where the activity is low level. Furthermore, after storing the data in corresponding memory 21A, the execution controller 83 initiates configuration of the FPGA 21B on the basis of the data stored in the memory 21A in the case where the activity is low level and zero level, or in the case of zero level.

In the Third Embodiment, even if a download request is received from a requesting node 3, extraction of the corresponding data from the memory 21A is initiated only in the case where the activity is low level and zero level, or in the case of zero level. As a result, services running on the FPGA 21B are minimally affected.

In the Third Embodiment, even if config data is received from a download source node 3, storing operations for storing the data in the memory 21A of the FPGA 21B are initiated only in the case where the activity is low level and zero level, or in the case of zero level. As a result, services running on the FPGA 21B are minimally affected.

In the Third Embodiment, even if config data is received from a download source node 3 and stored in corresponding memory 21A, configuration based on the data is initiated only in the case where the activity is low level and zero level, or in the case of zero level. As a result, services running on the FPGA 21B are minimally affected.

In the foregoing embodiments, the memory 21A which stores config data is described as being incorporated into the FPGAs 21 by way of example. However, it may also be configured such that memory is disposed externally to the FPGAs 21, with config data being stored therein. Such memory may be semiconductor memory such as SRAM, DRAM, EEPROM, and flash memory, or a hard disk, for example.

Also, memory 21A for storing config data in the FPGAs 21 may be omitted, if given a configuration in which it is possible to read out config data configured in the FPGAs 21.

In the foregoing embodiments, the load state 53 of a node 3 is set as a higher priority condition in the process for determining a download source node 3. However, the distance information 54 may be set as a higher priority condition than the load state 53. Priority conditions may also be set by user instructions or according to traffic conditions on the transmission pathways of the network 2.

Also, in the foregoing embodiments, although config data is reconstructed from a complete set of received partial data in operation S61 illustrated in FIG. 9, configuration may also be executed individually for each piece of partial data without reconstructing the config data.

Also, the CPU 34 in the main control card 13 of each node 3 may also be configured to be able to install a plug-in control program via the network 2 or by using a recording medium. In this case, the CPU 34 may execute a request process which issues download requests for config data for FPGAs 21 to different nodes 3 connected to the network 2 on the basis of a request program included in the plug-in control program.

Additionally, the CPU 34 may execute a store process which stores config data acquired from a node 3 in response to a download request in the memory 21A of an FPGA 21 on the basis of a store program included in the plug-in control program. Additionally, the CPU 34 may execute an execute process which causes the FPGA controller 22 to configure an FPGA 21 on the basis of config data stored in the memory 21A included in that FPGA 21.

Each node 3 issues a request to download config data from a node 3 retaining, in its memory 21A, config data that corresponds to a type of FPGA 21 in the requesting node 3. Additionally, each node 3 configures its FPGAs 21 on the basis of downloaded config data. As a result, all nodes 3 storing config data can potentially become a download source node 3, thus making it possible to distribute the concentration of bandwidth usage and processing load when downloading config data.

Note that the components of the respective units illustrated in the drawings are not limited to being physically configured exactly as configured in the drawings. In other words, the specific configuration in which respective units are separated or joined is not limited to that illustrated in the drawings, and all or part thereof may be functionally or physically separated or joined in arbitrary units according to various factors such as load and usage conditions.

Furthermore, all or arbitrary parts of the various processing functions conducted in respective apparatus may also be executed in a central processing unit (CPU) or other unit such as a microprocessor unit (MPU) or microcontroller unit (MCU). Obviously, all or arbitrary parts of the various processing functions may also be executed in a program interpreted and executed by a CPU (or other unit such as a MPU or MCU), or executed in hardware by wired logic.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A field programmable gate array (FPGA) mounted apparatus included in a first node of a plurality of nodes connected on a network, the FPGA mounted housing apparatus comprising:

a printed circuit board (PCB) on which an FPGA is mounted; and a controller configured to search for configuration data, issue a request to acquire configuration data of the FPGA to a second node of the plurality of nodes, and configure the FPGA based on the configuration data acquired from the second node in response to the request.

2. The FPGA mounted apparatus according to claim 1, wherein the controller includes a managing unit configured to manage data identification information for identifying the configuration data, in association with device identification information for identifying the second node storing the configuration data, and wherein the controller retrieves, from the managing unit, the device identification information associated with the data identification information for identifying configuration data to be acquired, and issues the request to acquire the configuration data to the second node corresponding to the retrieved device identification information.

3. The FPGA mounted apparatus according to claim 1, wherein the PCB includes a monitor configured to monitor a load state of the FPGA, and wherein, when the load state of the FPGA falls below a reference level, the PCB included in the second node retrieves the configuration data in response to the request, or the PCB included in the first node configures the FPGA based on the configuration data acquired in response to the request.

4. The FPGA mounted apparatus according to claim 1, wherein the controller includes a managing unit configured to manage data Identification information for identifying a plurality of partial data into which the configuration data has been partitioned plurally, in association with device identification information for identifying the second node storing respective partial data, wherein the controller retrieves, from the managing unit, the respective device identification information associated with the data identification information for identifying respective partial data forming part of the configuration data to be acquired, issues the request to acquire the respective partial data to respective second node corresponding to the retrieved device identification information, and configures the FPGA based on the partial data acquired from the second node in response to the request.

5. The FPGA mounted apparatus according to claim 4, wherein the PCB includes a monitor configured to detect data errors in the Configuration data, and identifies the partial data when a data error is detected, wherein the controller retrieves, from the managing unit, the device identification information associated with the data identification information for the partial data identified by the monitor, and issues a request to acquire the partial data to the second node corresponding to the retrieved device identification information.

6. A field programmable gate array (FPGA) configuration method of an FPGA mounted apparatus included in a first node of a plurality of nodes connected on a network, the FPGA mounted apparatus including a printed circuit board (PCB) on which an FPGA is mounted, the FPGA configuration method comprising:

searching for configuration data;

issuing a request to acquire configuration data of the FPGA to a second node of the plurality of nodes; and configuring the FPGA based on the configuration data acquired from the second node in response to the request, by a processor.

7. A non-transitory computer-readable recording medium storing a program that causes a computer to execute a procedure, the computer-readable recording medium being included in a controller included in a field programmable gate array (FPGA) mounted apparatus included in a first node of a plurality of nodes connected on a network, the procedure comprising:

searching for configuration data issuing a request to acquire configuration data of the FPGA to a second node of the plurality of nodes; and configuring the FPGA based on the configuration data acquired from the second node in response to the request.

* * * * *

UNITED STATES PATENT AND TRADEMARK OFFICE
CERTIFICATE OF CORRECTION

| | | |
|---|---|---|
| PATENT NO. | : 8,901,960 B2 | Page 1 of 1 |
| APPLICATION NO. | : 13/625341 | |
| DATED | : December 2, 2014 | |
| INVENTOR(S) | : Asuka Takano et al. | |

It is certified that error appears in the above-identified patent and that said Letters Patent is hereby corrected as shown below:

In the Claims

Column 15, Line 33, In Claim 4, delete "Identification" and insert -- identification --, therefor.

Column 16, Line 8, In Claim 5, delete "Configuration" and insert -- configuration --, therefor.

Column 16, Line 36, In Claim 7, delete "data" and insert -- data; --, therefor.

Signed and Sealed this
Fifth Day of May, 2015

Michelle K. Lee
*Director of the United States Patent and Trademark Office*